United States Patent
Kuo et al.

(10) Patent No.: US 10,225,051 B1
(45) Date of Patent: Mar. 5, 2019

(54) MEASUREMENT SYSTEM AND DATA TRANSMISSION INTERFACE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Hung-Chang Kuo, Hsinchu (TW); Ting-Hsu Chien, Hsinchu (TW); Hua-Shih Liao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/925,787

(22) Filed: Mar. 20, 2018

(30) Foreign Application Priority Data

Nov. 30, 2017 (CN) .......................... 2017 1 1236747

(51) Int. Cl.
*H04L 1/20* (2006.01)
*G01R 31/317* (2006.01)
*H04L 7/00* (2006.01)
*H04L 7/033* (2006.01)
*G06F 1/04* (2006.01)

(52) U.S. Cl.
CPC ........ *H04L 1/205* (2013.01); *G01R 31/31709* (2013.01); *H04L 7/0008* (2013.01); *G06F 1/04* (2013.01); *H04L 7/033* (2013.01)

(58) Field of Classification Search
CPC ....... H04L 1/205; H04L 7/0008; H04L 7/033; G01R 31/31709; G06F 1/04
See application file for complete search history.

(56) References Cited

U.S. PATENT DOCUMENTS 7,730,361 B2 * 6/2010 Das ..................... G06F 11/0745
714/33
2017/0364458 A1 * 12/2017 Corbin .................. G06F 13/385

FOREIGN PATENT DOCUMENTS

TW 201705693 A 2/2017

* cited by examiner

*Primary Examiner* — Vineeta S Panwalkar
(74) *Attorney, Agent, or Firm* — CKC & Partners Co., LLC

(57) ABSTRACT

A measurement system of a data transmission interface includes a signal generator and a signal receiver. The signal generator transmits an input data to the data transmission interface. The signal receiver receives an output data from the data transmission interface. The signal receiver measures a jitter tolerance capability of the data transmission interface according to error feedback data of the output data. The data transmission interface includes a receiving circuit, a synchronous circuit, and a transmitting circuit. The receiving circuit receives the input data and generates an error signal when a data error occurs. The synchronous circuit receives the error signal to generate an error indication signal. The transmitting circuit transmits the output data to the signal receiver and receives the error indication signal when the data error occurs, in order to generate the error feedback data in the output data according to the error indication signal.

20 Claims, 6 Drawing Sheets

CT

| D1 | 11 |
| D2 | 22 |
| D3 | 33 |
| D4 | 44 |
| D5 | 55 |
| D6 | 66 |
| D7 | 77 |
| D8 | 88 |
| D9 | 99 |

Fig. 3

MEASUREMENT SYSTEM AND DATA TRANSMISSION INTERFACE

CROSS-REFERENCE TO RELATED APPLICATION

This application claims the priority benefit of CHINA Application serial no. 201711236747.7, filed Nov. 30, 2017, the full disclosure of which is incorporated herein by reference.

FIELD OF INVENTION

The invention relates to a measurement system and a data transmission interface. More particularly, the invention relates to a measurement system and a data transmission interface for measuring the jitter tolerance capability.

BACKGROUND

In data transmission interface, jitter refers to the deviation of the expected value of the periodic signal over time. Since some jitter is unavoidable, a need to exhibit some jitter tolerance for the modern data transmission interface and meet the performance requirements exists. In fact, many industry standards require the data transmission interface to have a jitter tolerance measured according to different metrics. Therefore, manufacturers, researchers, engineers and end users are concerned about the jitter tolerance capability of data transmission interface or wafers and their measurement methods. Traditionally, there has been a measurement method of jitter tolerance capability of data transmission interface, that is, the jitter and output data are transmitted to the data transmission interface by the measuring equipment, and then the jitter tolerance of the data transmission interface is determined by analyzing the output of the data transmission interface as an evaluation of its jitter tolerance capability.

However, the traditionally low-end measurement equipment may not measure the jitter tolerance capability of the data transmission interface when operating in clock domain crossing, especially the jitter tolerance capability when operating at high frequency. In addition, although high-end measurement equipment may measure the jitter tolerance capability of the data transmission interface during clock domain crossing, it is relatively expensive and not affordable by typical measurement units.

Therefore, how to reduce the cost of the measurement equipment and effectively measure the jitter tolerance capability of the data transmission interface when operating in clock domain crossing at the same time, especially the jitter tolerance capability at high frequencies, are the problems to be improved in this field.

SUMMARY

An aspect of this disclosure is to provide a measurement system of a data transmission interface is disclosed. The measurement system includes a signal generator and a signal receiver. The signal generator is coupled to a data transmission interface, and the signal generator is configured to transmit an input data to the data transmission interface. The signal receiver is coupled to the data transmission interface, and the signal receiver is configured to receive output data from the data transmission interface, in which the signal receiver measures out a jitter tolerance capability of the data transmission interface according to error feedback data of the output data. The data transmission interface includes a receiving circuit, a synchronous circuit, and a transmitting circuit. The receiving circuit is coupled to the signal generator, in which the receiving circuit operates at a first clock signal, and the receiving circuit is configured to receive the input data and generate an error signal when a data error occurs. The synchronous circuit is coupled to the receiving circuit, in which the synchronous circuit receives the error signal to generate an error indication signal. The transmitting circuit is coupled to the synchronous circuit, the receiving circuit, and the signal receiver, in which the transmitting circuit operates at a second clock signal, and the transmitting circuit is configured to transmit the output data to the signal receiver and receive the error indication signal when the data error occurs, in order to generate the error feedback data in the output data according to the error indication signal.

Another aspect of this disclosure is to provide a data transmission interface includes a receiving circuit, a synchronous circuit, and a transmitting circuit. The receiving circuit is coupled to the signal generator. The receiving circuit operates at a first clock signal and is configured to receive input data from the signal generator, and generates an error signal if a data error occurs. The synchronous circuit is coupled to the receiving circuit. The synchronous circuit receives the error signal to generate an error indication signal. The transmitting circuit is coupled to the synchronous circuit, the receiving circuit, and the signal receiver, the transmitting circuit operates at a second clock signal and is configured to transmit an output data to the signal receiver, the transmitting circuit receives the error indication signal when the data error occurs, and generates error feedback data in the output data according to the error indication signal.

Therefore, according to the technical concept of the present invention, embodiments of this disclosure are to provide a data transmission interface and a measurement system, and in particular, a data transmission interface and a measurement system, so as to reduce the cost of the measurement system, measure the jitter tolerance capability of the data transmission interface effectively under the condition of clock domain crossing, and measure the jitter tolerance capability of the data transmission interface effectively when the output data is high frequency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a schematic diagram illustrating a data look-up table according to some embodiments of the present disclosure.

DETAILED DESCRIPTION

Figure 1:
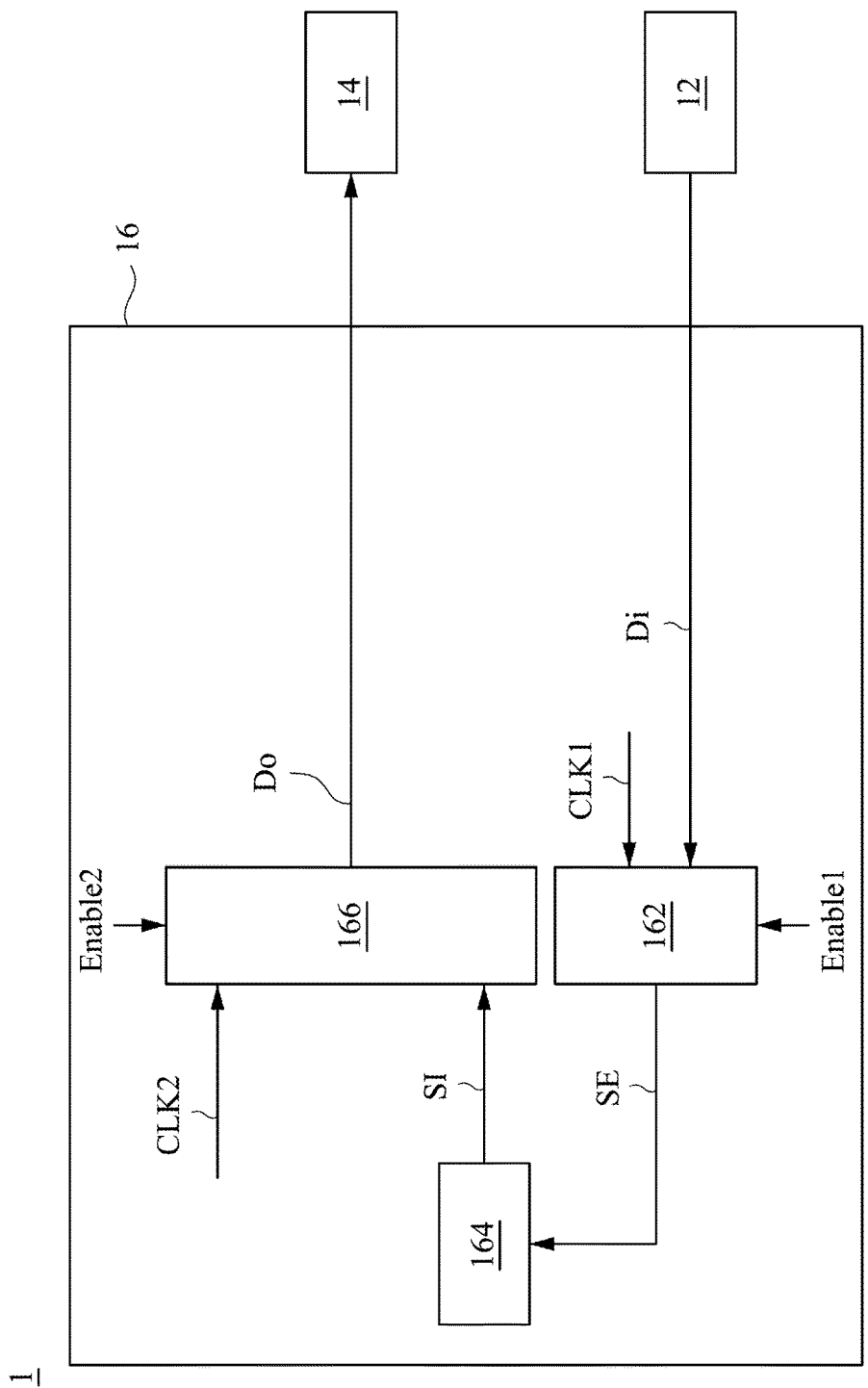
FIG. 1 is a schematic diagram illustrating a measurement system according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a measurement system 1 according to some embodiments of the present disclosure. Measurement system 1 includes data transmission interface 16, signal generator 12, and signal receiver 14. In the connection relationship, data transmission interface 16 couples to the signal generator 12 and the signal receiver 14 respectively. Furthermore, as shown in the FIG. 1, data transmission interface 16 includes receiving circuit 162, synchronous circuit 164 and transmitting circuit 166, wherein the receiving circuit 162 and the transmitting circuit 166 operates at different operation clock respectively (Non-common Clock). In the connection relationship, the receiving circuit 162 couples to the signal generator 12. The synchronous circuit 164 couples to the receiving circuit 162. The transmitting circuit 166 couples to the synchronous circuit 164 and the signal receiver 14. The measurement system 1 illustrated in FIG. 1 is for illustrative purposes only, and the present disclosure is not limited to this.

Figure 2:
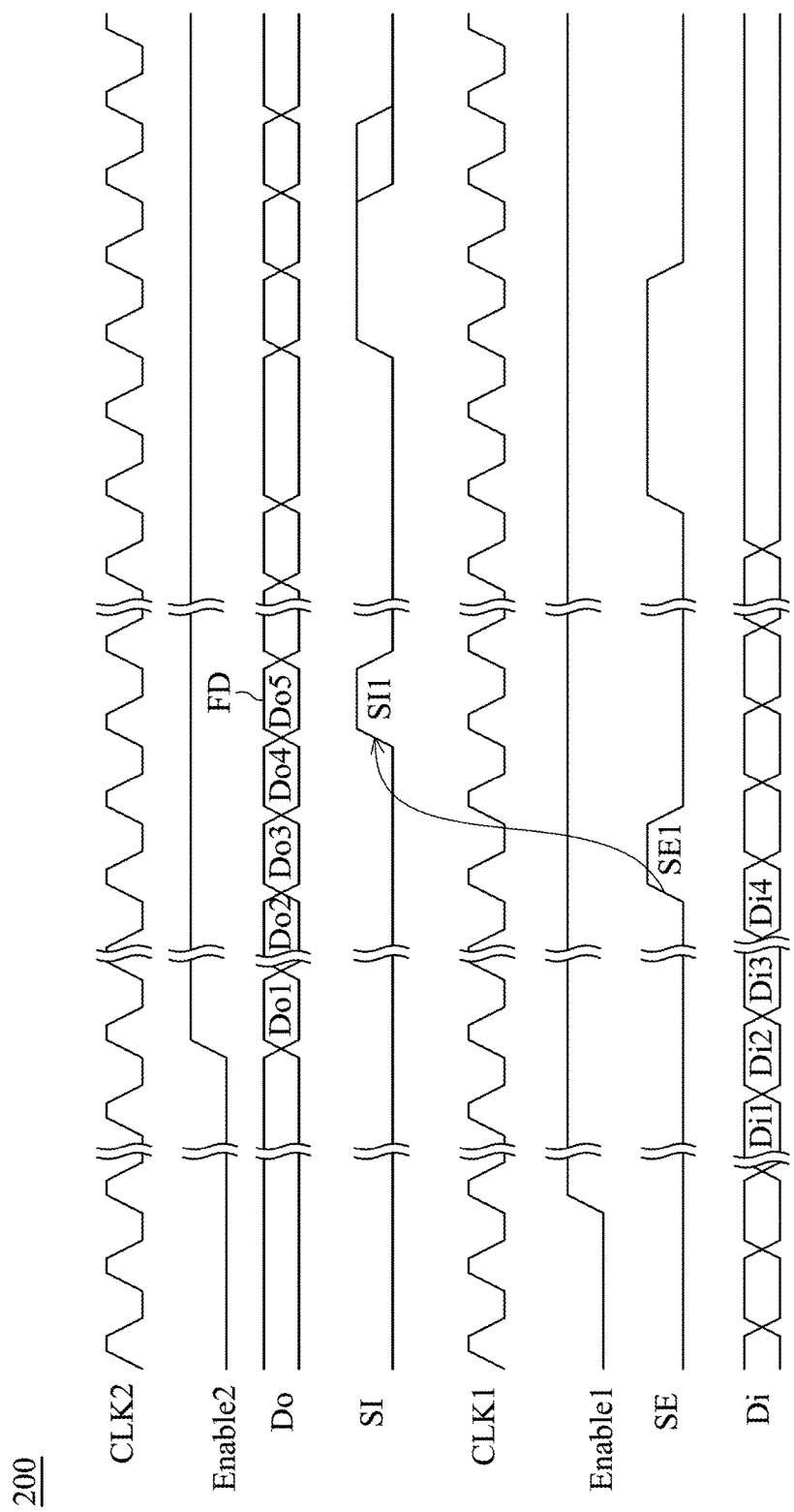
FIG. 2 is a schematic diagram illustrating a measurement waveform plot according to some embodiments of the present disclosure.

For the ease of understanding the operation method of the measurement system 1 illustrated in FIG. 1, FIG. 2 is illustrated. FIG. 2 is a schematic diagram illustrating a measurement waveform plot 200 according to some embodiments of the present disclosure. The operation method of the measurement system 1 may be described in detail with FIG. 1 and FIG. 2.

In the operation relationship, signal generator 12 is configured to transmit an input data Di with jitter signal to the data transmission interface 16. The receiving circuit 162 of the data transmission interface 16 is switched on by the control of the enabling signal Enable1. The receiving circuit 162 is configured to receive the input data Di and determine whether the input data Di is correct or not. In addition, the transmitting circuit 166 of the data transmission interface 16 is switched on by the control of the enabling signal Enable2. The transmitting circuit 16 is configured to send an output data Do to the signal receiver 14. In the forgoing, when it is determined that the input data Di the receiving circuit 162 receives is correct, the transmitting circuit 166 may generate a correct output data Do to the signal receiver 14 correspondingly. At this time, the signal receiver 14 may know that the data transmission interface 16 would not be influenced by the jitter signal.

Then, the signal generator 12 transmits the second input data Di with a stronger jitter signal to the data transmission interface 16. If the second input data Di is determined to be correct, the transmitting circuit 166 correspondingly generates second output data Do, which is correct, and sends the second output data Do to the signal receiver 14. On the contrary, if the second input data Di is determined to be incorrect, the transmitting circuit 166 generates the output data Do with the error feedback data FD and sends the output data Do to the signal receiver 14. As such, the signal receiver 14 may further measure out the lowest jitter tolerance and the jitter tolerance capability of the data transmission interface 16 according to the output data Do received.

Furthermore, when an error occurs in the input data Di with the jitter signal, the receiving circuit 162 may generate an error signal SE and sends the error signal SE to the synchronous circuit 164. The synchronous circuit 164 further generates error indication signal SI according to the error signal SE, and transmits the error indication signal SI to the transmitting circuit 166, so as to notify the transmitting circuit 166 that an error has occurred with the input data Di. Accordingly, the transmitting circuit 166 may further generate output data Do with error feedback data FD according to the notification of the error indication signal SI, and sends the output data Do with the error feedback data FD to the signal receiver 14.

In this way, the signal receiver 14 may measure out the lowest jitter tolerance and the jitter tolerance capability of the data transmission interface 16 according to the output data Do with the error feedback data FD.

It is to be noted that the receiving circuit 162 is operated at the first clock signal CLK1, and the transmitting circuit 166 is operated at the second clock signal CLK2. In some embodiments, the synchronous circuit 164 is operated based on the clock domain crossing (CDC). The synchronous circuit 164 receives the error signal SE from the receiving circuit 162 according to the first clock signal CLK1, and outputs the error indication signal SI to the transmitting circuit 166 according to the second clock signal CLK2. In this way, the synchronous circuit 164 may be the synchronized communication bridge between the receiving circuit 162 and the transmitting circuit 166. In some embodiments, the first clock signal CLK1 and the second clock signal CLK2 are clock signals with the same frequency and different phases or clock signals with different frequencies. How the receiving circuit 162 and the transmitting circuit 166 collaboratively operates is according to the data look-up table, so as to effectively measure the jitter tolerance capability of the data transmission interface 16 when it is operated in asynchronous clocks, which may be described in detail in the following embodiments.

In some embodiments, each of the signal generator 12, the signal receiver 14, the receiving circuit 162, and the transmitting circuit 166 may include the same data look-up table CT (as shown in FIG. 3). In some embodiments, the signal generator 12 generates an input data Di with jitter signal according to the internal data look-up table CT. In some embodiments, after the receiving circuit 162 of the data transmission interface 16 receives the input data Di, the receiving circuit 162 compares the internal data look-up table CT and the input data Di to determine whether the received input data Di is correct or not, and generates an error signal SE when a data error has occurred. As aforementioned, when the input data Di is determined to be correct, the transmitting circuit 166 may correspondingly generate an output data Do, which is correct, according to the internal data look-up table CT, and sends the correct output data Do to the signal receiver 14. The signal receiver 14 compares the internal data look-up table CT and the correct output data Do, and further measures out the data transmission interface 16 which includes the capability of resisting the jitter signal.

If it is determined that the input data Di is incorrect, the transmitting circuit 166 may receive the error indication signal SI from the synchronous circuit 164, load the error feedback data FD into the output data Do according to the notification of the error indication signal SI, so as to make it a wrong output data Do, and further transmits the wrong output data Do to the signal receiver 14. In this way, the signal receiver 14 measures out that the data transmission interface 16 does not include the capability of resisting the jitter signal according to the wrong output data Do, which is also called the lowest jitter tolerance of the data transmission interface 16.

For example, each of the data look-up table CT of signal generator 12, the signal receiver 14, the receiving circuit 162 and the transmitting circuit 166 includes at least one group of data D1 to D9, in which data D1 to D9 are 11, 22, 33, 44 . . . 99 respectively. The signal generator 12 generates an input data Di which include data Di1 to Di9 and the jitter signal according to the data D1 to D9 in the internal data look-up table CT, in which the data Di1 to Di9 are 11, 22, 33, 44 . . . 99 respectively. The receiving circuit 162 receives the input data Di from the signal generator 12 and operating processes the input data Di to generate recovery data Dr1 to Dr9. Then, the receiving circuit 162 compares the recovery data Dr1 to Dr9 and the data D1 to D9 in the data look-up table CT, so as to determine whether the recovery data Dr1 to Dr9 exactly match the data D1 to D9 in the data look-up table CT.

After comparison, if the recovery data Dr1 to Dr9 exactly match the data D1 to D9 in the data look-up table CT, then the transmitting circuit 16 may correspondingly generate an output data Do which exactly matches the data D1 to D9 of the data look-up table CT according to the internal data look-up table CT, and send the output data Do to the signal receiver 14. The signal receiver 14 compares the internal data look-up table CT and the output data Do, and further measures out that the data transmission interface 16 includes the capability of resisting the jitter signal.

Moreover, after comparison, if the recovery value of the recovery data Dr4 in the recovery data Dr1 to Dr9 is "45", which does not match the value "44" of the data D4 in the data look-up table CT, at this time, the receiving circuit 162 may generate an error signal SE1, and transmit the error signal SE1 to the synchronous circuit 164. In some embodiments, the error signal SE1 includes the information that the recovery data Dr4 in the recovery data Dr1 to Dr9 is a wrong data.

The aforementioned data D1 to D9 in the data look-up table CT may be a pseudo-random binary sequence Pattern (PRBS Pattern), at this time, the receiving circuit 162 may repeatedly generate and output the PRBS pattern according to the data look-up table CT. Moreover, PRBS pattern is not the only option; all that may be used as a high-speed stream test pattern code may be used as the data D1-D9 in the data look-up table CT, for example, K28.5, 1010, CJPAT or other patterns.

The synchronous circuit 164 according to the first clock signal CLK1 may know that a data error occurs in the recovery data Dr4 in the recovery data Dr1 to Dr9 when receiving the error signal SE1. Then, the synchronous circuit 164 according to the second clock signal CLK2 outputs error indication signal SI1 to the transmitting circuit 166, to notify the transmitting circuit 166 that a data error has occurred at the end of the receiving circuit 162. It is worth mentioning that, the circuit characteristics of the synchronous circuit 164 may cause a time delay between the error signal SE1 and the error indication signal SI1. Therefore, when the aforementioned delay in time is considered, after the transmitting circuit 166 knows that the recovery data Dr4 occurs data error, the transmitting circuit 166 loads the error feedback data FD into one of the data Do4 to Do9 of the output data Do according to the internal data look-up table CT, so as to make it a wrong output data Do. The best situation is that the transmitting circuit 166 immediately loads the error feedback data FD into data Do4 of the output data Do. If the transmission delay is considered, the transmitting circuit 166 loads the error feedback data FD into one of the data Do5 to the data Do9 of the output data Do, which may similarly provide the signal receiver 14 to measure out the lowest jitter tolerance and jitter tolerance capability of the data transmission interface 16.

As aforementioned, one of the data Do4 to Do9 containing error feedback data FD is significantly different from the corresponding one of data D4 to D9 in the data look-up table CT. For example, data Do4 containing error feedback data FD is "88", which is significantly different from "44" of the data D4. Or, the data Do5 with error feedback data FD is "99", which is significantly different from "55" of the data D5.

In this way, the transmitting circuit 166 loads the error feedback data FD into data Do5 of the output data Do according to the error indication signal SI1, so that data Do5 is significantly different from the data D5 in the data look-up table CT, which further lets the signal receiver 14 be able to determine the occurrence of the data error easily. For example, if in each of the data look-up table CT of the signal generator 12, the signal receiver 14, the receiving circuit 162, and the transmitting circuit 166, the data D4 is "44", and the recovery data generated by the receiving circuit 162 is "45", at this time, the transmitting circuit 166 may send output data Do with data Do4 being "88" or output data Do with data Do5 being "99".

In this way, when the signal receiver 14 receives the output data Do, the signal receiver 14 may determine that an error occurred in data Do4 or data Do5 of the output data Do more easily. That is, user may easily determine whether the output data Do of the data transmission interface 16 exist data error when using low end signal receiver 14, which may indirectly measure out the lowest jitter tolerance and jitter tolerance capability of the data transmission interface 16, and may further decrease the cost of the signal receiver 14.

Figure 4:
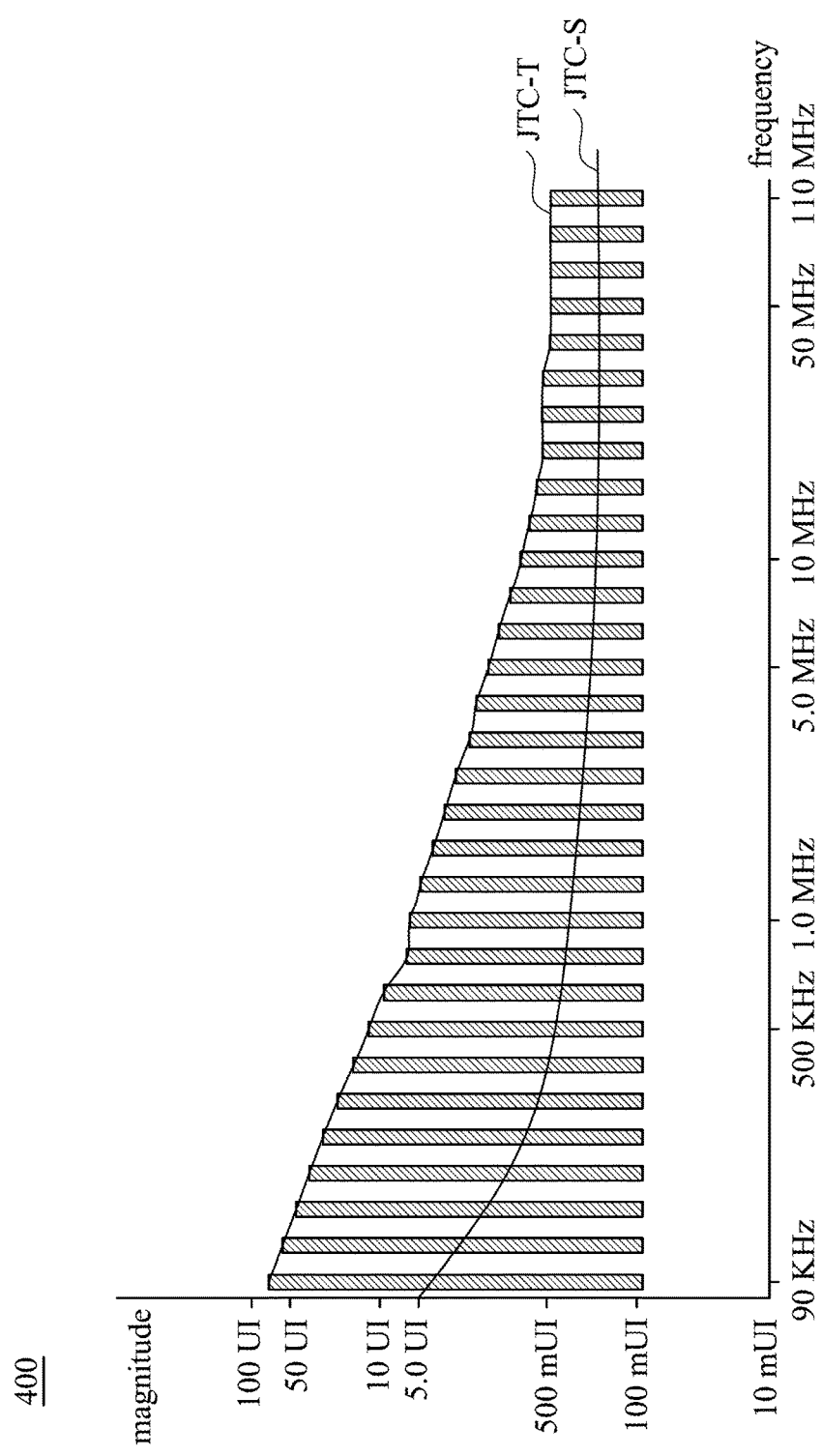
FIG. 4 is an experimental data illustrating a jitter tolerance graph according to some embodiments of the present disclosure.

Reference is made to FIG. 4. FIG. 4 is an experimental data illustrating a jitter tolerance graph 400 according to some embodiments of the present disclosure. The horizontal axis of the experimental data chart represents the jitter operation frequency(Hz) of the input signal Di, the vertical axis of the experimental data chart represents the jitter signal magnitude that the input signal Di contains, in which the unit is the unit interval. The experimental data chart may be generated by the signal receiver 14 according to the output data Do, so as to explain under the operating conditions with different frequencies, the lowest jitter tolerance and jitter tolerance capability of the data transmission interface 16. Furthermore, the standard measuring line JTC-S in the experimental data chart represents that under the conditions of each of the jitter operation frequencies, the jitter tolerance capability that the data transmission interface 16 basically to be reached, and the best measuring line JTC-T of the experimental data chart represents that under the conditions of each of the jitter operation frequencies, the lowest jitter tolerance that the data transmission interface 16 is able to achieve.

To be more detailed, the signal generator 12 under the condition of 90 KHz of the jitter operation frequency, loads the jitter signal with magnitude of 100 mUI into the input data Di, and transmits to the data transmission interface 16. The signal receiver 14 then receives the output data Do send by the data transmission interface 16 according to the aforementioned method, and determine whether the output data Do is correct or not. At this time, if it is determined that the output data Do is correct, the experimental data chart presents that the data transmission interface 16 may correctly process the input data Di with 90 KHz of the jitter operation frequency and 100 mUI of the jitter signal magnitude. The slashed part represents the range that the data transmission interface 16 may correctly process the input data Di. That is, under the condition that the jitter frequency of the input data Di being 90 KHz, the range of the jitter tolerance capability of the data transmission interface 16 is 100 mUI to 75 UI, in which the lowest jitter tolerance of the data transmission interface 16 is 75 UI. The input data Di of the remaining frequencies may be determined by analogy.

In this way, by viewing the experimental data of the experimental data chart, whether the data transmission interface 16 passes the measurement of the jitter tolerance capability or not may be determined according to whether the best measuring line JTC-T is better than the standard measuring line JTC-S or not.

Figure 5:
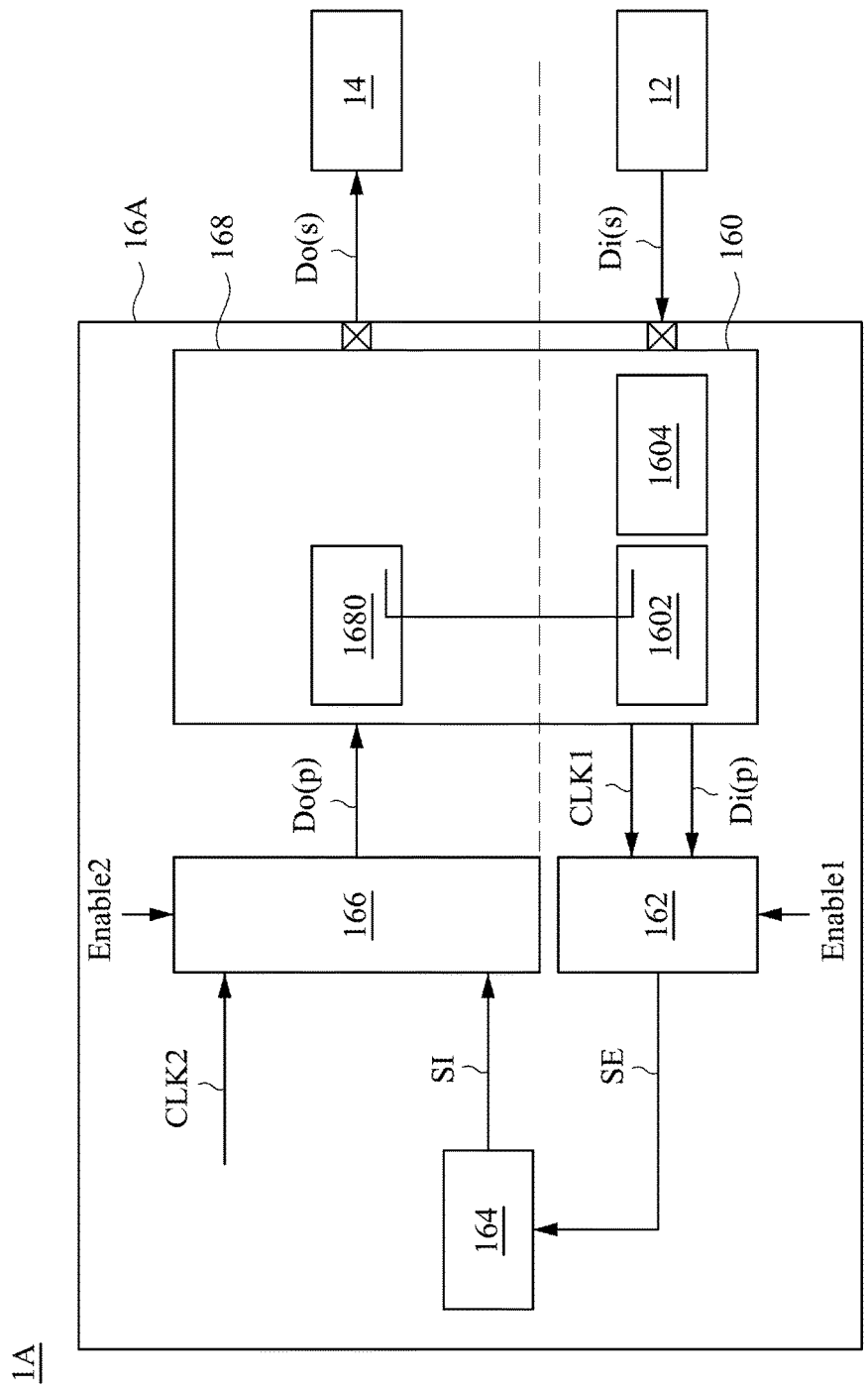
FIG. 5 is a schematic diagram illustrating a measurement system according to some embodiments of the present disclosure.

FIG. 5 is a schematic diagram illustrating another measurement system 1A according to some embodiments of the present disclosure. In some embodiments, the data transmission interface 16A further includes a first data transforming circuit 160. The first data transforming circuit 160 is coupled to the signal generator 12 and the receiving circuit 162. The first data transforming circuit 160 receives serial input data Di(s) from the signal generator 12, transforms the serial input data Di(s) into parallel input data Di(p), and transmits the parallel input data Di(p) to the receiving circuit 162.

In some embodiments, the data transmission interface 16A further includes a second data transmission circuit 168. The second data transmission circuit 168 is coupled to the signal receiver 14 and the transmitting circuit 166. The second data transmission circuit 168 receives parallel output data Do(p) from the transmitting circuit 166, transforms the parallel output data Do(p) into serial output data Do(s), and transmits the serial output data Do(s) to the signal receiver 14.

In some embodiments, the first data transforming circuit 160 further includes a deserializer 1602. The deserializer 1602 is configured to transform the serial input data Di(s) into the parallel input data Di(p). In some embodiments, the second data transmission circuit 168 further includes a serializer 1680. The serializer 1680 is configured to transform the parallel output data Do(p) into the serial output data Do(s).

In some embodiments, the first data transforming circuit 160 further includes a clock and data recovery circuit (CDR) 1604. The clock and data recovery circuit 1604 is configured to recover the input data Di and the clock of the input data Di.

In some embodiments, the data transmission interface 16, 16A include PCIe, USB, SATA, MiPi physical, Ethernet, HDMI, DisplayPort or Thunderbolt.

Figure 6:
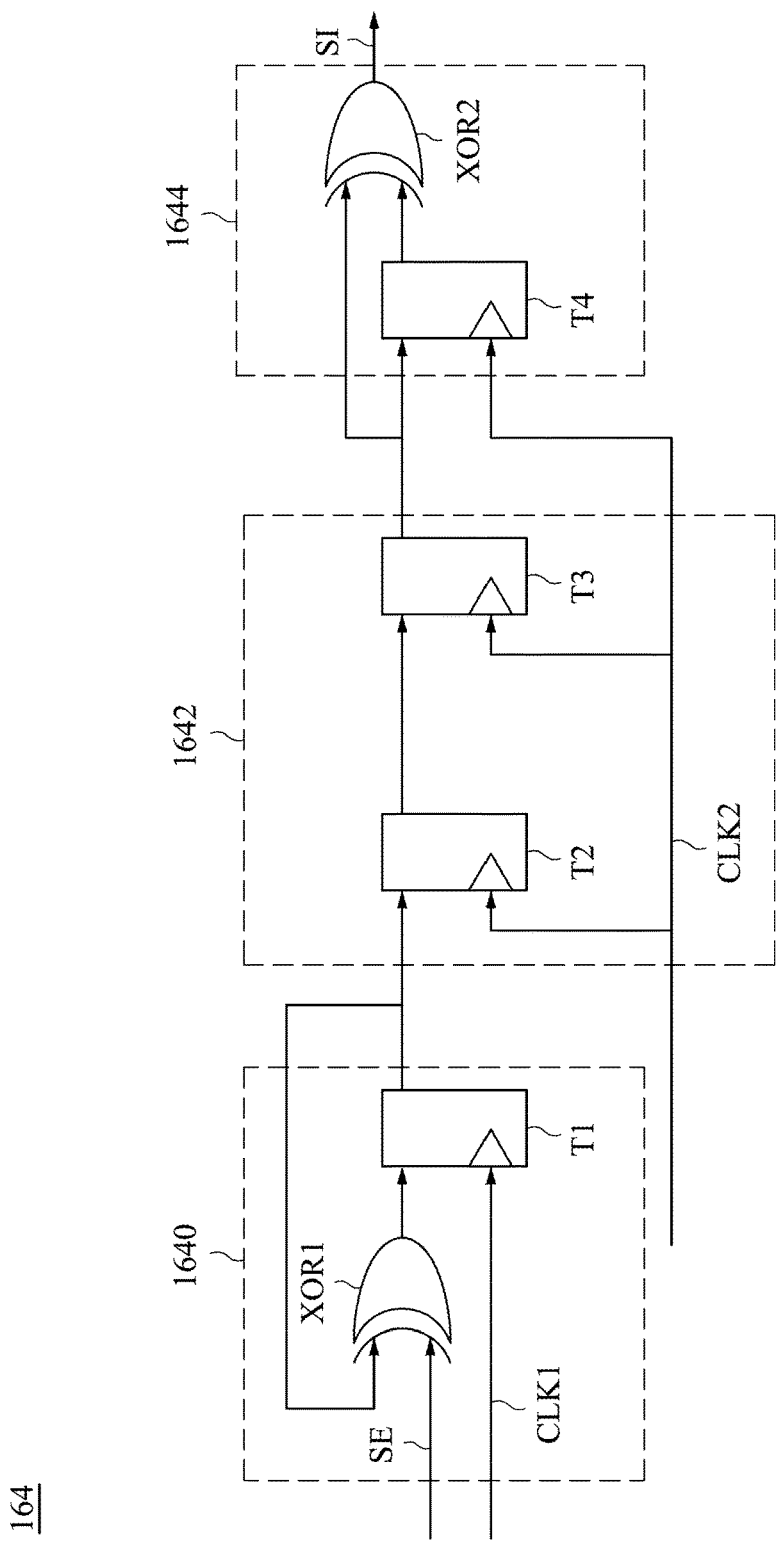
FIG. 6 is a schematic diagram illustrating a synchronous circuit according to some embodiments of the present disclosure.

Reference is made to FIG. 2 and FIG. 6. FIG. 6 is a schematic diagram illustrating a synchronous circuit 164 according to some embodiments of the present disclosure. The synchronous circuit 164 is a pulse synchronous circuit (Pulse Synchronizer) which may synchronize the pulse signal operated at the first clock signal CLK1 time domain (e.g., error signal SE) to the second clock signal CLK2 time domain (e.g., error indication signal SI). The synchronous circuit 164 includes a front end circuit 1640, a middle end circuit 1642, and a back end circuit 1644, as in the aforementioned, the front end circuit 1640 includes a D-type flip-flop T1 and an XOR gate XOR1. The middle end circuit 1642 includes middle D-type flip-flops T2, T3. The back end circuit 1644 includes a D-type flip-flopT4 and an XOR gate XOR2. As illustrated in FIG. 6, the front end circuit 1640 operates at the first clock signal CLK1 time domain to transmit the error signal SE to the middle end circuit 1642. The middle end circuit 1642 operates at the second clock signal CLK2 time domain to transmit the error signal SE to the back end circuit 1644. The back end circuit 1644 operates at the second clock signal CLK2 time domain to transform the error signal SE into the error indication signal SI.

As aforementioned, in some embodiments, the synchronous circuit 164 used in the data transmission interface 16, 16A of the present disclosure may operate based on clock domain crossing (CDC), which receives the error signal SE according to the first clock signal CLK1 and outputs the error indication signal SI according to the second clock signal CLK2, and further serve as a bridge for communication between the receiving circuit 162 and the transmitting circuit 166. In this way, the measurement system 1, 1A in the present disclosure may not be influenced when the receiving circuit 162 and transmitting circuit 166 do not operate synchronize. The measurement system 1, 1A still may measure the jitter tolerance capability of the data transmission interface 16, 16A effectively.

Moreover, the synchronous circuit 164 used in the data transmission interface 16, 16A of the present disclosure may synchronously notify the transmitting circuit 166 when a data error occurs in the receiving circuit 162, so that the transmitting circuit 166 may generate and transmit the output data Do containing the error feedback data FD to the signal receiver 14, which lets the signal receiver 14 easily determine that a data error has occurred to the receiving circuit 162. Relatively, the measurement staff may easily measure the jitter tolerance capability of the data transmission interface 16, 16A with signal receiver 14 of lower accuracy, which further reduces the cost of the signal receiver 14. Moreover, as shown in FIG. 4, the measurement system 1, 1A and the data transmission interface 16, 16A in the present disclosure may also measure the jitter tolerance capability of the data transmission interface 16, 16A effectively even under the condition that the output data Di being high frequency.

According to the embodiments mentioning above, the embodiments of this disclosure are to provide a data transmission interface and a measurement system, and in particular, a data transmission interface and a measurement system, so as to reduce the cost of the measurement system, measure the jitter tolerance capability of the data transmission interface effectively under the condition of clock domain crossing, and measure the jitter tolerance capability of the data transmission interface effectively when the output data is high frequency.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other manufacturing processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A measurement system of a data transmission interface, comprising:
    a signal generator coupled to a data transmission interface, wherein the signal generator is configured to transmit an input data to the data transmission interface;
    a signal receiver coupled to the data transmission interface, wherein the signal receiver is configured to receive an output data from the data transmission interface, wherein the signal receiver measures out a jitter tolerance capability of the data transmission interface according to an error feedback data of the output data;
    wherein the data transmission interface comprises:
    a receiving circuit coupled to the signal generator, wherein the receiving circuit operates at a first clock signal, and the receiving circuit is configured to receive the input data and generate an error signal when a data error occurs;
    a synchronous circuit coupled to the receiving circuit, wherein the synchronous circuit receives the error signal to generate an error indication signal; and
    a transmitting circuit coupled to the synchronous circuit, the receiving circuit, and the signal receiver, wherein the transmitting circuit operates at a second clock signal, and the transmitting circuit is configured to transmit the output data to the signal receiver and receive the error indication signal when the data error occurs, in order to generate the error feedback data in the output data according to the error indication signal.

2. The measurement system of claim 1, wherein the synchronous circuit operates based on clock domain crossing (CDC), and the synchronous circuit receives the error signal according to the first clock signal, and outputs the error indication signal according to the second clock signal.

3. The measurement system of claim 2, wherein the first clock signal and the second clock signal are clock signals of same frequency and different phases, or clock signals of different frequencies.

4. The measurement system of claim 2, wherein each of the signal generator, the signal receiver, the receiving circuit, and the transmitting circuit has a data look-up table, and the data look-up table of each of the signal generator, the signal receiver, the receiving circuit and the transmitting circuit are same.

5. The measurement system of claim 4, wherein the signal generator generates the input data according to the data look-up table.

6. The measurement system of claim 4, wherein the receiving circuit mathematically processes the input data to generate a recovery data, and the receiving circuit compares the data look-up table and the recovery data, and the receiving circuit generates the error signal when the data error occurs.

7. The measurement system of claim 4, wherein the transmitting circuit outputs the output data according to the data look-up table, and the transmitting circuit generates the error feedback data in the output data when the data error occurs.

8. The measurement system of claim 1, wherein the data transmission interface further comprises:
    a first data transforming circuit coupled to the signal generator and the receiving circuit, wherein the first data transforming circuit receives serial input data from the signal generator, transforms the serial input data into parallel input data, and sends the parallel input data to the receiving circuit.

9. The measurement system of claim 8, wherein the data transmission interface further comprises:
    a second data transmission circuit coupled to the signal receiver and the transmitting circuit, the second data transmission circuit receives the parallel output data from the transmitting circuit, transform the parallel output data into the serial output data, and sends the output data to the signal receiver.

10. The measurement system of claim 1, wherein the data transmission interface comprises a Peripheral Component Interconnect Express (PCIe), an USB, a SATA, a MiPi physical, an Ethernet, a HDMI, a DisplayPort or a Thunderbolt.

11. A data transmission interface, coupled to a signal generator and a signal receiver, the data transmission interface comprising:
    a receiving circuit coupled to the signal generator, wherein the receiving circuit operates at a first clock signal and is configured to receive an input data from the signal generator, and generates an error signal when data error occurs;
    a synchronous circuit coupled to the receiving circuit, wherein the synchronous circuit receives the error signal to generate an error indication signal; and
    a transmitting circuit coupled to the synchronous circuit, the receiving circuit, and the signal receiver, wherein the transmitting circuit operates at a second clock signal and is configured to transmit an output data to the signal receiver, the transmitting circuit receives the error indication signal when the data error occurs, and generates error feedback data in the output data according to the error indication signal.

12. The data transmission interface of claim 11, wherein the synchronous circuit operates based on clock domain crossing (CDC) and is configured to receive the error signal according to the first clock signal, and outputs the error indication signal according to the second clock signal.

13. The data transmission interface of claim 12, wherein the first clock signal and the second clock signal are clock signals of same frequency and different phases, or clock signals of different frequencies.

14. The data transmission interface of claim 12, wherein each of the signal generator, the signal receiver, the receiving circuit and the transmitting circuit has a data look-up table, and the data look-up table of each of the signal generator, the signal receiver, the receiving circuit and the transmitting circuit are same.

15. The data transmission interface of claim 12, wherein the signal generator generates the input data according to the data look-up table.

16. The data transmission interface of claim 12, wherein the receiving circuit mathematically processes the input data to generate a recovery data, the receiving circuit compares the data look-up table and the recovery data, and the receiving circuit generates the error signal when the data error occurs.

17. The data transmission interface of claim 12, wherein the transmitting circuit outputs the output data according to the data look-up table, and the transmitting circuit generates the error feedback data in the output data when the data error occurs.

18. The data transmission interface of claim 12, wherein the data transmission interface further comprises:
- a first data transforming circuit coupled to the signal generator and the receiving circuit, wherein the first data transforming circuit receives serial input data from the signal generator, transforms the serial input data into parallel input data, and sends the parallel input data to the receiving circuit.

19. The data transmission interface of claim 12, wherein the data transmission interface further comprises:
- a second data transmission circuit coupled to the signal receiver and the transmitting circuit, wherein the second data transmission circuit receives the parallel output data from the transmitting circuit, transforms the parallel output data into the serial output data, and sends the output data to the signal receiver.

20. The data transmission interface of claim 12,
wherein the data transmission interface comprises a Peripheral Component Interconnect Express (PCIe), an USB, a SATA, a MiPi physical, an Ethernet, a HDMI, a DisplayPort or a Thunderbolt.

* * * * *

UNITED STATES PATENT AND TRADEMARK OFFICE
CERTIFICATE OF CORRECTION

PATENT NO. : 10,225,051 B1
APPLICATION NO. : 15/925787
DATED : March 5, 2019
INVENTOR(S) : Hung-Chang Kuo, Ting-Hsu Chien and Hua-Shih Liao It is certified that error appears in the above-identified patent and that said Letters Patent is hereby corrected as shown below:

In the Claims
Column 11, Line 16, replace "12" after "claim" with "14";
Column 11, Line 19, replace "12" after "claim" with "14";
Column 11, Line 25, replace "12" after "claim" with "14".

Signed and Sealed this
Tenth Day of October, 2023

Katherine Kelly Vidal
Director of the United States Patent and Trademark Office